(12) United States Patent
Shimizu

(10) Patent No.: US 7,041,418 B2
(45) Date of Patent: May 9, 2006

(54) METHOD FOR MEASURING GAP BETWEEN MASK AND SUBSTRATE OF DISPLAY PANEL

(75) Inventor: Takeshi Shimizu, Tokyo (JP)

(73) Assignee: NEC Plasma Display Corporation, Tokyo (JP)

( * ) Notice: Subject to any disclaimer, the term of this patent is extended or adjusted under 35 U.S.C. 154(b) by 0 days.

(21) Appl. No.: 10/633,716

(22) Filed: Aug. 5, 2003

(65) Prior Publication Data

US 2004/0029028 A1 Feb. 12, 2004

(30) Foreign Application Priority Data

Aug. 5, 2002 (JP) .............................. 2002/227269

(51) Int. Cl.
*G03F 9/00* (2006.01)
*G03C 5/00* (2006.01)
(52) U.S. Cl. ........................... 430/30; 430/22; 430/945
(58) Field of Classification Search ................. 430/22, 430/30, 945
See application file for complete search history.

(56) References Cited

FOREIGN PATENT DOCUMENTS

| JP | 07-260424 A | 10/1995 |
|---|---|---|
| JP | 11-194501 A | 7/1999 |
| JP | 2001-12905 A | 1/2001 |
| KR | 0157279 | 5/1999 |

*Primary Examiner*—Christopher G. Young
(74) *Attorney, Agent, or Firm*—Sughrue Mion, PLLC

(57) ABSTRACT

A method of measuring a gap between a mask and a substrate by providing a mask and a substrate facing each other. The mask includes an array of patterns, and a at least one window disposed between two of the patterns. Each of the patterns corresponds to a display device. The method also includes projecting an incident laser beam onto the substrate through the window of the mask and determining a gap between the mask and the substrate in a middle region of the substrate in response to first and second reflected beams. The first reflected beam is generated by the reflection of the incident laser beam by the mask, and the second reflected beam is generated by the reflection of the incident laser beam by the substrate. Determining the gap between the mask and the substrate in the middle region allows for the correction of any undesirable deflection of the mask.

11 Claims, 12 Drawing Sheets

METHOD FOR MEASURING GAP BETWEEN MASK AND SUBSTRATE OF DISPLAY PANEL

BACKGROUND OF THE INVENTION

1. Field of the Invention

The present invention relates to a method of measuring a gap between a mask and a substrate of flat panel displays, such as plasma display panels and liquid crystal displays.

2. Description of the Related Art

A photolithography process for providing patterns on substrates of flat panel displays is a part of the fabrication of the flat panel displays. The exposure phase of the photolithographic process is achieved by aligners.

Aligners for fabrication of flat panel displays often adopt a proximity exposure method. The proximity exposure method involves maintaining a small gap, 50 to 250 microns wide, between the substrate and the mask during exposure. This gap minimizes mask damage.

A conventional aligner for proximity exposure is disclosed in Japanese Unexamined Patent Application No. Jp-A 2001-12905. FIG. 1 shows a schematic of a conventional aligner and is designated by reference numeral 150. The aligner 150 includes a substrate stage 106 that has an upper surface 106S. A transparent substrate 104, such as a glass substrate, is disposed on the upper surface 106 and is secured by vacuum clamping. The upper surface 106S is square and has a side-length of L6.

The substrate stage 106 is connected to stage drivers 143, which are respectively controlled by controllers 140. The positional control of the substrate stage 106, including the vertical control and leveling, is achieved by controllers 140 and stage drivers 143.

As shown in FIG. 2, the substrate 104 is square and has a side-length of L4. Except for the reflective square regions 105 near the corners of the main surface of the substrate 104, the main surface of the substrate 104 is covered with a photo resist 104a (FIG. 1). That is, the substrate 104 is exposed at the square regions 105. The exposed square regions are referred to as gap measuring reflector regions 105, hereinafter. The gap measuring reflector regions 105 have a side-length of L5.

As shown in FIG. 1, the aligner 150 includes a frame-structured mask stage 103 onto which a square mask 101 having a side-length of L1 is secured. The mask 101 has a main surface, disposed opposite substrate 104, on which a transfer pattern is formed. As shown in FIG. 3, transparent gap measuring marks 102 are disposed near the respective corners of the mask 101. The gap measuring windows 102 are square and have a side-length of L2.

As shown in FIG. 1, the aligner 150 also includes laser beam emitters 107, such as laser diodes, and laser beam detectors 108, such as photo diodes. The laser beam emitters 107 and the laser beam detectors 108 are disposed over the mask 101. The laser beam emitters 107 project laser beams 109 onto the gap measuring windows 102 at an angle of 45 degree with respect to the mask 101. A part of each laser beam 109 is reflected by the mask 101 to generate a reflected beam 110 while the other part of the each laser beam 109 passes through the gap measuring windows 102 to generate a reflected beam 111. Each of the laser beam detectors 108 receives the reflected beam 110 from the mask 101 and the reflected beam 111 from the substrate 104.

The exposure process by the aligner 150 begins with positioning the mask 101 and the substrate 104 so that the centers of the windows 102 and the reflector regions 105 are aligned.

Then, the gaps between the mask 101 and the substrate 104 are measured at the corners with the laser beam emitters 107 and the laser beam detectors 108. The laser beam emitters 107 respectively project the laser beams 109 onto the gap measuring windows 102 at an angle of incident of 45 degrees. The laser beam detectors 108 receive the reflected beams 110 from the mask 101 and the reflected beams 111 from the substrate 104, and the laser beam detectors 108 generate spot position data representative of the positions of the spots where the laser beam detectors 108 receive the reflected beams 110 and 111. The spot position data may be representative of the distance between the spots of the reflected beams 110 and 111 provided on the laser beam detectors 108. Controllers 140 calculate the associated gaps between the mask 101 and the substrate 104, located near the corners, on the basis of the spot position data received from the receivers 108.

Controllers 140 then operate drivers 143 to control the position of the substrate stage 106 so that the gaps becomes equal.

After positioning substrate stage 106, the photo resist disposed on the substrate 104 is exposed with an ultraviolet light, which goes through the pattern on the mask 101.

However, the conventional aligner thus described suffers from a problem in that the pattern on the substrate requires reflective gap measuring marks. This undesirably reduces flexibility of the design of the pattern on the substrate.

An aligner that solves this problem is disclosed in Japanese Unexamined Patent Application No. Jp-A-Heisei 11-194501. This aligner is equipped with a substrate holder, a thickness measuring unit, a gap sensor and a controller. The substrate holder has an upper surface on which a substrate is secured. The thickness measuring unit measures the thickness of the substrate. The gap sensor determines the gap between the mask and the upper surface of the substrate holder. The controller calculates the gap between the mask and the substrate from the gap between the mask and the upper surface of the substrate holder and the thickness of the substrate, and the controller regulates the gap between the mask and the substrate in response to the calculated gap. This eliminates the need for providing reflective gap measuring marks on the substrate.

Another aligning method to achieve accurate alignment of the mask and the substrate is disclosed in Japanese Unexamined Patent Application No. Jp-A-Heisei 7-260424. This aligning method provides first alignment marks, consisting of diffraction gratings, on the mask at predetermined intervals, and also provides second alignment marks of diffraction gratings on the substrate. A laser beam emitted from a He—Ne laser is projected onto the mask and the substrate and is diffracted by the first and second alignment marks respectively disposed on the mask and the substrate. The relative position of the mask and the substrate is determined on the basis of the diffracted beams from the first and second alignment marks. Using diffracted beams enables accurate determination of the relative position. The mask and the substrate are then aligned in response to the determined relative position. An accurate determination of the relative position allows the mask and the substrate to be accurately aligned.

Recently, the size of flat display panel substrates have been enlarged to improve production efficiency. Substrates having a length of more than one meter, for example, are commercially available. Enlarging the substrates allows for a plurality of display device to be fabricated on a single substrate, thus, decreasing the number of required steps. For example, a large substrate, on which a plurality of display device have been fabricated, reduces the number of exposure processes necessary for fabricating the same number of display devices. This effectively reduces the fabrication cost of the display devices.

Enlarging the substrate, however, produces an undesirable deflection of the mask because enlargement of the substrate is inevitably accompanied by the enlargement of the mask used in the exposure process. Any deflection of the mask prevents the gap between the mask and the substrate from being consistently regulated to a desired gap, and thus, enlarges the difference in the dimension of the pattern transferred to the substrate. In a region where the gap is larger than the desired gap, for example, the width of lines transferred to the substrate are undesirably larger than the desired width, and vice versa. As a result, the width of lines undesirably varies widely on the substrate.

To correct for the undesirable deflection of the mask, the deflection of the mask needs to be measured or determined. Accordingly, a need exists to provide a way for determining the deflection of the mask.

SUMMARY OF THE INVENTION

In summary, the present invention addresses determining and correcting the deflection of masks used for proximity exposure on enlarged substrates. Determining and correcting the deflection of a mask allows for consistently regulating the gap between the mask and the substrate.

In an aspect of the present invention, a method comprises:
providing a mask which includes:
an array of patterns, each of which corresponds to a display device,
a window disposed between two of the patterns,
placing a substrate to face the mask;
projecting an incident laser beam onto the substrate through the window of the mask; and
determining a gap between the mask and the substrate in a middle region of the substrate in response to first and second reflected beams, the first reflected beam being generated by the incident laser beam reflected by the mask, and the second reflected beam being generated by the incident laser beam being reflected by the substrate.

Determining the gap between the mask and the substrate in the middle region advantageously provides for correcting the undesirable deflection of the mask.

The array of patterns may be arranged in a row or in rows and columns.

When the mask includes other windows disposed around the array of the patterns, the method preferably includes:
projecting other incident laser beams onto the substrate through the other windows;
determining gaps between the mask and the substrate near corners of the substrate in response to third and fourth laser beams, the third laser beams being generated by the other incident laser beams being reflected by the mask, and the fourth laser beams being generated by the other incident laser beams being reflected by the substrate, and
determining a deflection of the mask based on the determined gap in the middle region and the gaps near the corners.

When the substrate is covered with a photo resist, it is advantageous that a portion of the main surface of the substrate is exposed, and a second reflected laser beam is generated by the incident laser beam being reflected by the exposed portion.

In an another aspect of the present invention, a proximity exposure method comprising:
providing a mask which includes:
an array of patterns, each of which respectively corresponds to a display device,
a window disposed between adjacent two of the patterns,
placing a substrate on a substrate stage opposed to the mask;
projecting an incident laser beam onto the substrate through the window of the mask; and
determining a gap between the mask and the substrate in a middle region of the substrate in response to first and second reflected beams, the first reflected beam being generated by the incident laser beam reflected by the mask, and the second reflected beam being generated by the incident laser beam being reflected by the substrate; and
removing a deflection of the mask in response to the determined gap in the middle region.

The removing preferably includes:
securing the mask and a glass plate to form a sealed space between the mask and the glass plate; and
inflating or evacuating the sealed space in response to the determined deflection.

The determination of the gap in the middle region may be executed every time the substrate is exchanged or every time the mask is exchanged.

DESCRIPTION OF THE PREFERRED EMBODIMENTS

Preferred embodiments of the present invention are described below in detail with reference to the attached drawings.

Figure 1:
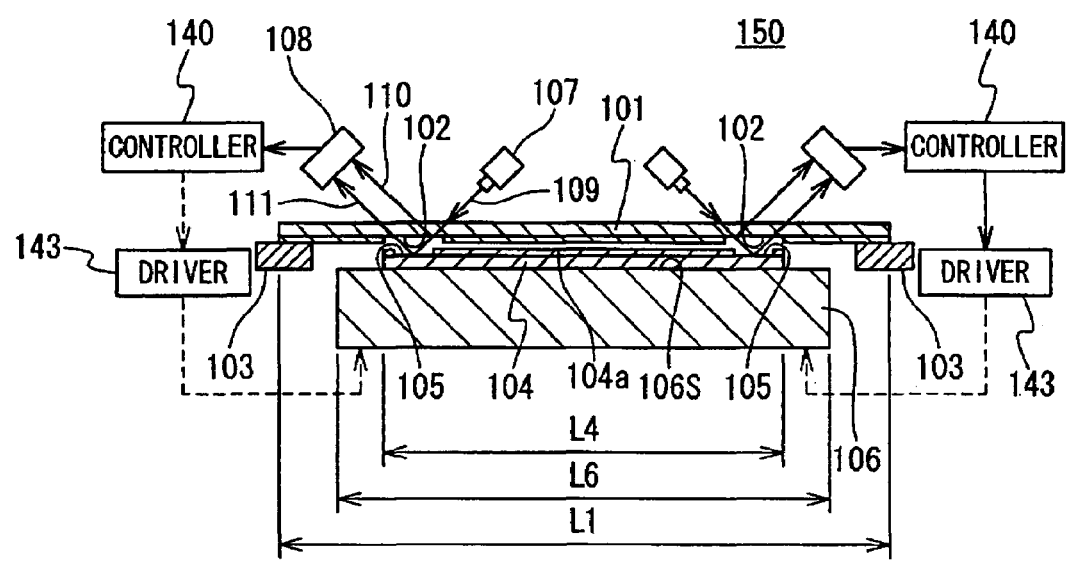
FIG. 1 is a schematic of a conventional aligner 150.
Figure 2:
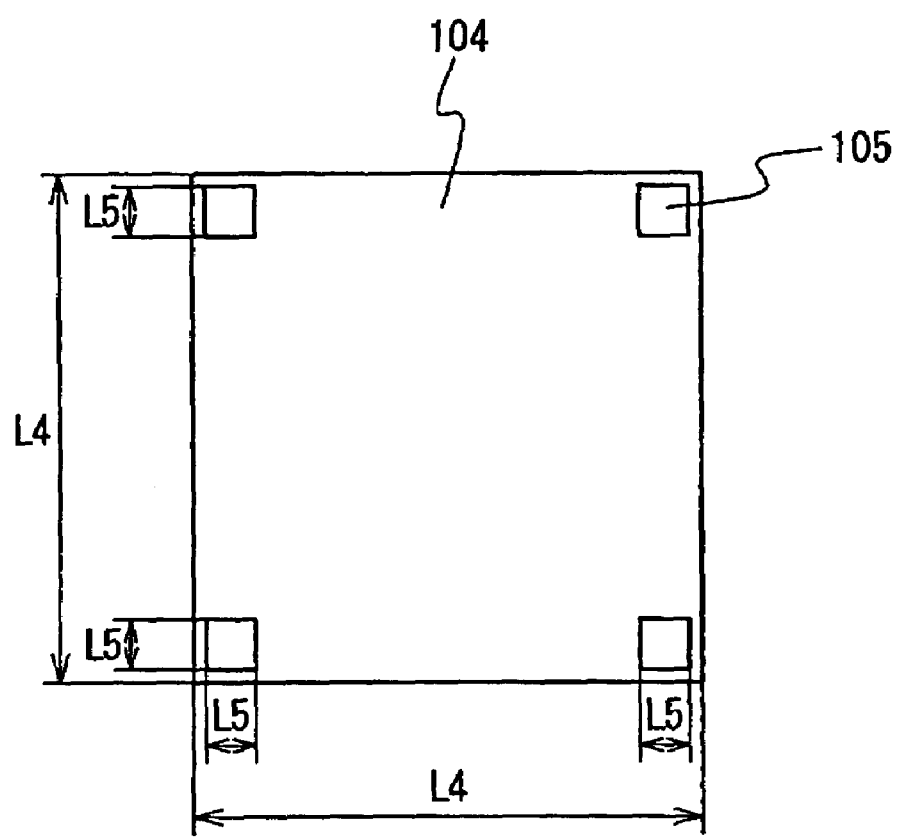
FIG. 2 shows a plan view of the substrate 104.
Figure 3:
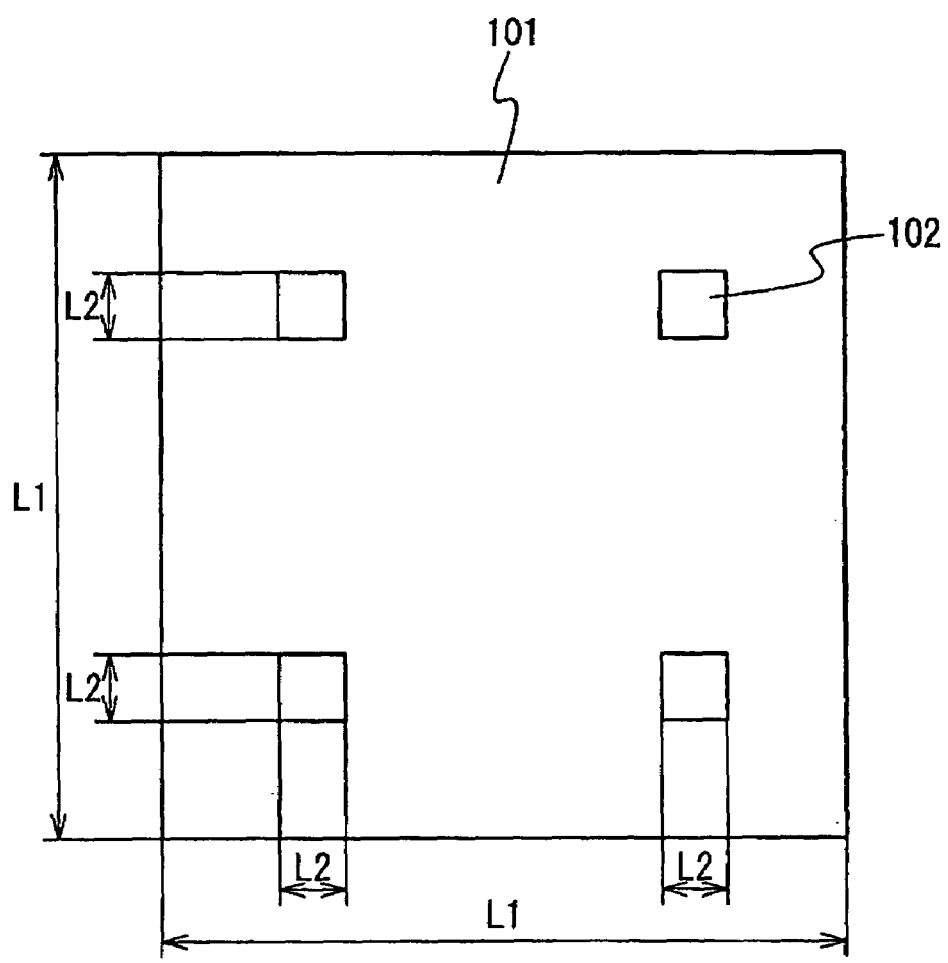
FIG. 3 shows a plan view of the mask 101.
Figure 4:
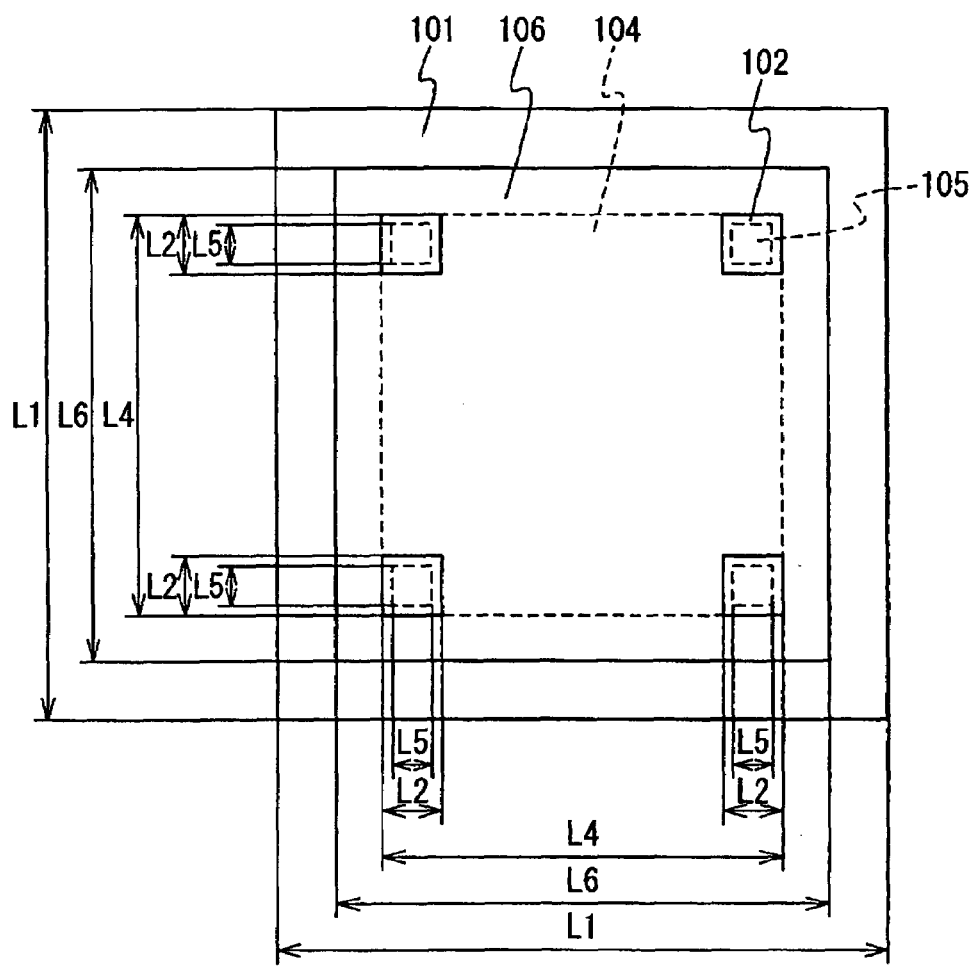
FIG. 4 shows a plan view illustrating an alignment of the mask 101 and the substrate 104.
Figure 5:
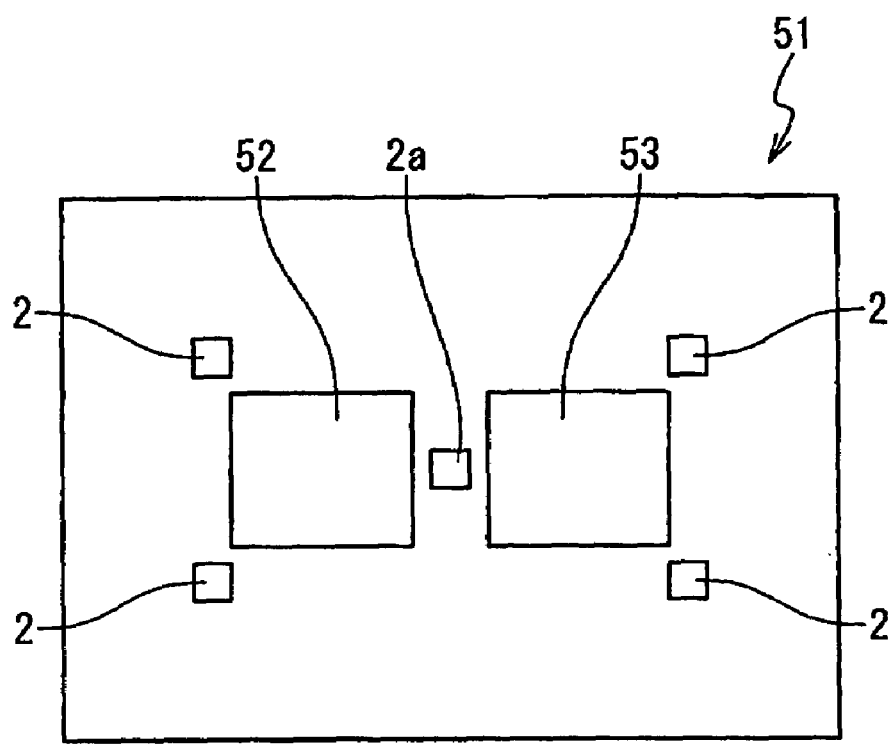
FIG. 5 shows a plan view of a mask used in an embodiment of the present invention.

In one embodiment, a glass mask 51 shown in FIG. 5 is used in the exposure process. The glass mask 51 includes an array of patterns 52 and 53, each of which corresponds to a complete display device (not to a portion of a display device). Patterns 52 and 53 are transferred to a substrate using a photolithography technique.

The glass mask 51 includes gap measuring windows 2 around patterns 52, and 53. The gap measuring windows 2 are transparent regions that allow light to pass through. The gap measuring windows 2 are positioned at the corners of mask 51.

A gap measuring window 2a is additionally disposed in a non-patterned region (or blank space) between patterns 52 and 53.

Figure 6:
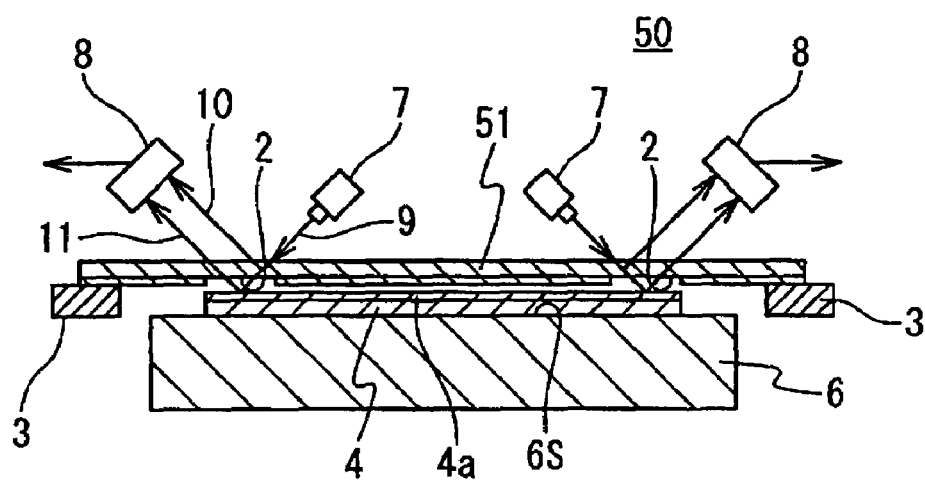
FIGS. 6 and 7 are schematics of an aligner used in the embodiment of the present invention.

FIG. 6 shows an aligner 50 that is consistent with this embodiment and is used in a proximity exposure process. The aligner 50 includes a frame-structured mask stage 3, a substrate stage 6, laser beam emitters 7 and laser beam detectors 8. The substrate stage 6 has an upper surface 6S on which a substrate 4 covered with a photo resist 4a is secured by vacuum clamping. The mask stage 3 supports the mask 51 so that the main surface of the mask 51 is opposite the main surface of the substrate 4.

The laser beam emitters 7 and the laser beam detectors 8 are used to determine gaps between the mask 51 and the substrate 4 near the corners thereof. The laser beam emitters 7 project laser beams 9 onto the gap measuring windows 2. A part of each laser beam 9 is reflected by the mask 51 while the other part of each laser beam 9 passes through the mask 51 and is reflected by the substrate 4. Each laser beam detector 8 receives the reflected laser beam 10 from the mask 51 and the reflected laser beam 11 from the substrate 4 and generates spot position data representative of the positions of the spots where each laser beam detector 8 receives the reflected beams 10 and 11. The spot position data may be representative of the distance between the spots of the reflected beams 10 and 11. The gaps between the mask 51 and the substrate 4 near the corners thereof are calculated on the basis of the spot position data developed by the laser beam detectors 8.

Figure 7:
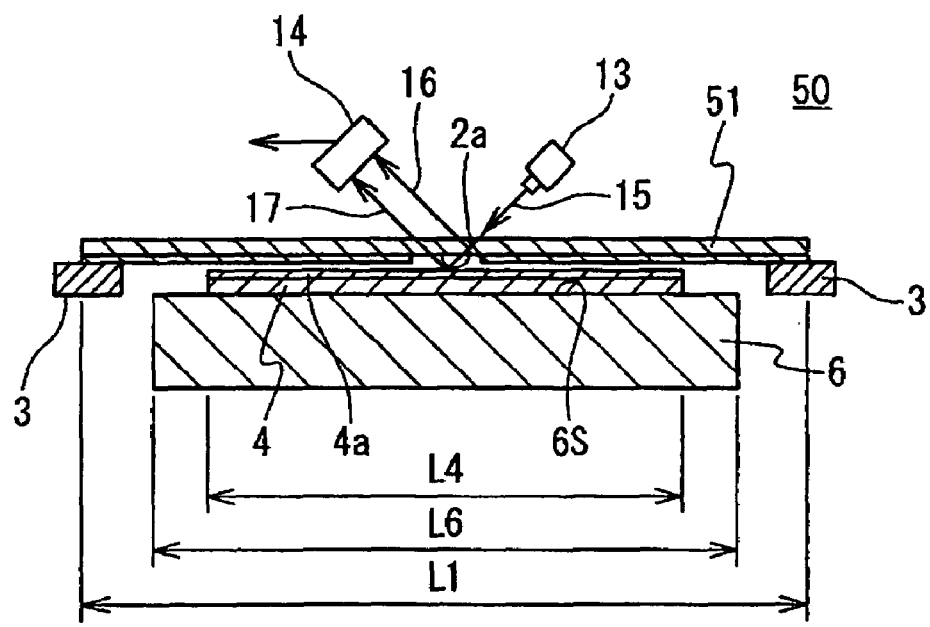

As shown in FIG. 7, the aligner 50 additionally includes a laser beam emitter 13 and a laser beam detector 14 to measure or determine a gap between the mask 51 and the substrate 4 in the middle region thereof. The laser beam emitter 13 projects a laser beam 15 onto the gap measuring window 2a. A part of the laser beam 15 is reflected by the mask 51 while the other part of the laser beam 15 passes through the mask 51 and is reflected by the substrate 4. The laser beam detector 14 receives the reflected laser beam 16 from the mask 51 and the reflected laser beam 17 from the substrate 4, and laser beam detector 14 generates spot position data representative of the positions of the spots where the laser beam detector 14 receives the reflected beams 16 and 17. The spot position data may be representative of the distance between the spots of the reflected beams 16 and 17. The gap between the mask 51 and the substrate 4 in the middle region thereof is calculated on the basis of the spot position data from the laser beam detector 14.

Figure 8:
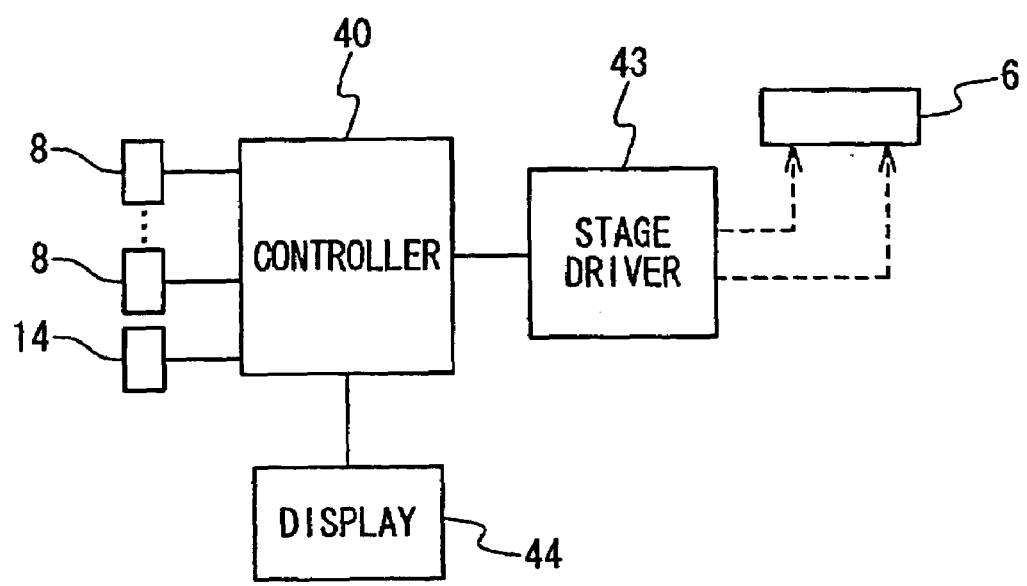
FIG. 8 is a block diagram of the aligner.

As shown in FIG. 8, the laser beam detectors 8 and 14 respectively provide the spot position data for a controller 40 to determine the gaps between the mask 51 and the substrate 4. In response to the spot position data from the laser beam detectors 8, the controller 40 determines the gaps between the mask 51 and the substrate 4 near the corner thereof. Furthermore, the controller 40 determines the gap between the mask 51 and the substrate 4 in the middle region thereof in response to the spot position data from the laser beam detector 14. The controller 40, in response to the determined gaps (including both near the corners and in the middle region), operates the stage driver 43 to control the position of the substrate stage 6.

In addition, controller 40 calculates the deflection of the mask 51 on the basis of the gaps near the corners and in the middle region. Controller 40 displays the calculated deflection of the mask 51 on the screen of the display 44.

The determination of the gaps between the mask 51 and the substrate 4 on the substrate stage 6, and the calculation of the deflection of the mask 51 may be periodically executed. For example, the determination of the gaps and the calculation of the deflection may be executed every other week or month. When a predetermined number of substrates go through the exposure process by the aligner 50, the periodic determination of the gaps helps regulate the gaps between the mask 51 and the substrate 6 to a desired value.

When the number of substrates going through the exposure process using the aligner 50 in a given day is varied, the determination of the gaps between the mask and the substrate and the calculation of the deflection of the mask is preferably executed every time the substrate 4, which is placed on the substrate stage 6, is exchanged or every time the mask 51 is exchanged.

Figure 9:
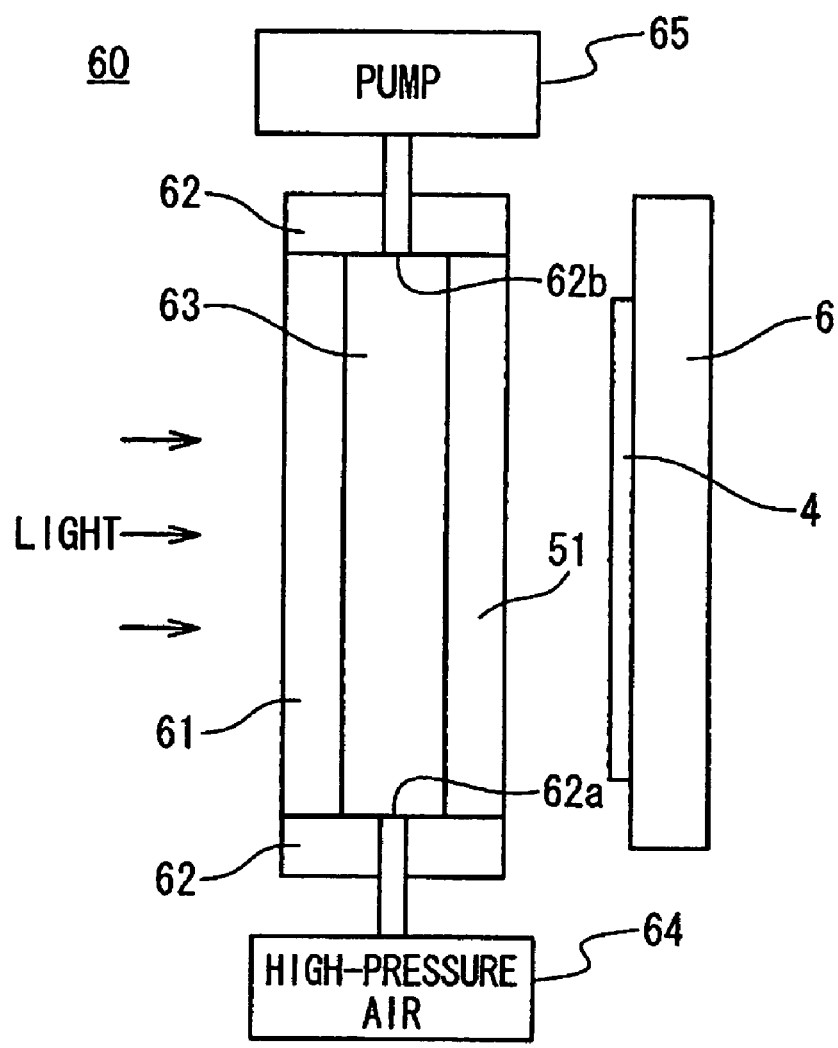
FIG. 9 shows a deflection remover used in the embodiment.

The calculation of the deflection of the mask 51 is preferably followed by correcting the deflection from the mask 51. In order to correct the deflection from the mask 51, the aligner 50 preferably includes a deflection remover 60 as shown in FIG. 9.

The deflection remover 60 includes a transparent glass plate 61 and a mask holder 62. The glass plate 61 is the same size as the mask 51. The mask holder 62 fixes the mask 51 so that the mask 51 is disposed opposite the glass plate 61 and provides a sealed space 63 therebetween. The transparent glass plate 61 allows laser beams 9 and 15 emitted from laser beam emitters 7 and 13 (FIGS. 6 and 7) to be projected onto the mask 51 and the substrate 4 therethrough.

The mask holder 62 is provided with a gas inlet 62a and a gas outlet 62b. The gas inlet 62a is coupled to a tank 64 filled with high pressure air, and the gas outlet 62b is coupled to a vacuum pump 65. The tank 64 and the vacuum pump 65 are operated in response to the calculated deflection of the mask 51.

In the event that the mask 51 is convex, toward the substrate 4, the vacuum pump 65 is operated to evacuate the sealed space 63. The evacuation of the sealed space 63 exerts a force on the mask 51 toward the glass plate 61 to remove the deflection of the mask 51.

In the event that the mask 51 is concave, toward the glass plate 61, the tank 65 is operated to inflate the sealed space 63. The inflation by the tank 65 exerts a force on the mask 51 toward the substrate 4 to remove the deflection of the mask 51.

The pressure of the sealed space 63 is regulated by the tank 64 and the vacuum pump 65 in response to the deflection of the mask 51, i.e., the gap between the mask 51 and the substrate 4 in the middle region thereof. Accordingly, the deflection of the mask 51 is appropriately removed.

Figure 10:
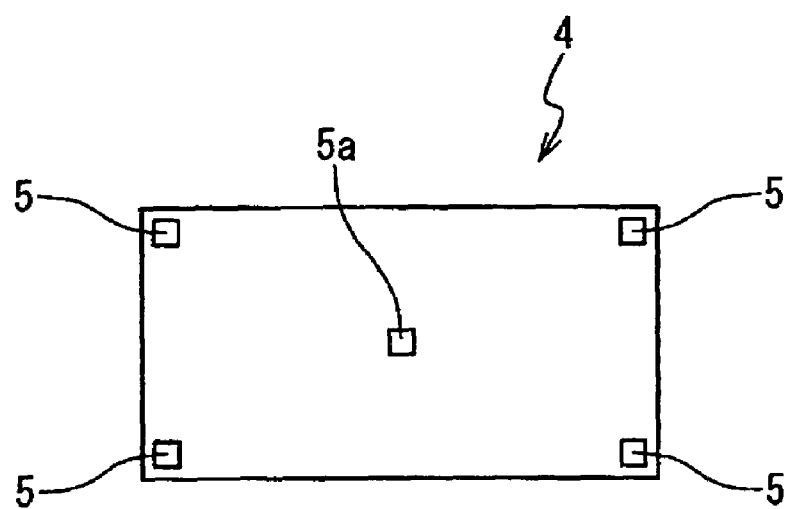
FIG. 10 shows a plan view of a substrate with reflective regions.

As shown in FIG. 10, it is advantageous if square portions of the main surface of the substrate 4 are exposed (that is, not covered with the photo resist 4a(FIG. 6)) in order to improve the reflection coefficient of the substrate 4. The exposed square portions in the corners of the substrate 4 are referred to as reflective regions 5, and the exposed square portion in the middle region of the substrate 4 is referred to as a reflective region 5a. The reflective regions 5 are positioned so that the reflective regions 5 face the gap measuring windows 2 disposed near the corners of the mask 51 when the substrate 4 is aligned to the mask 51. Correspondingly, the reflective regions 5a faces the gap measuring windows 2a in the middle region of the mask 51 when the substrate 4 is aligned to the mask 51. Preferably, the photo resist 4a is applied by printing onto the substrate 4 in order to facilitate the formation of the reflective regions 5 and 5a.

Figure 11:
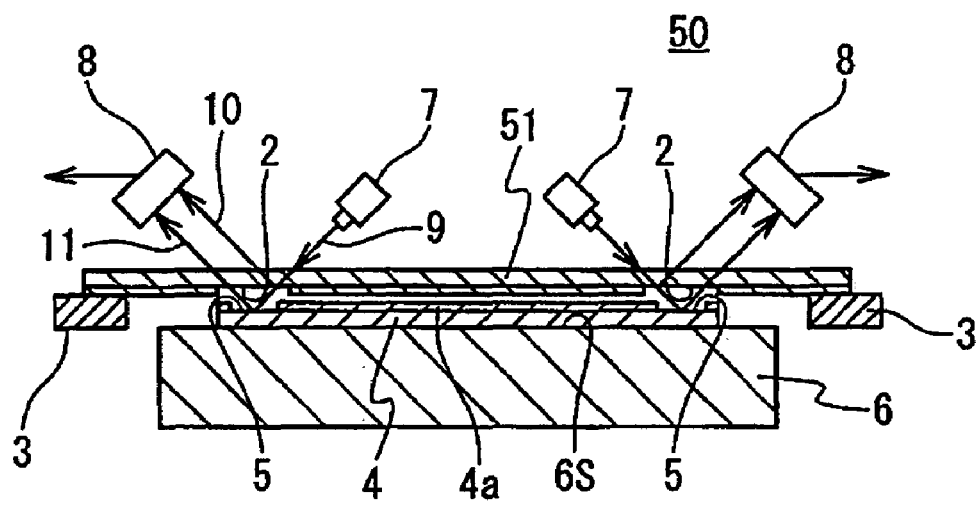
FIGS. 11 and 12 show a method of determining gaps using the reflective regions provided for the substrate.
Figure 12:
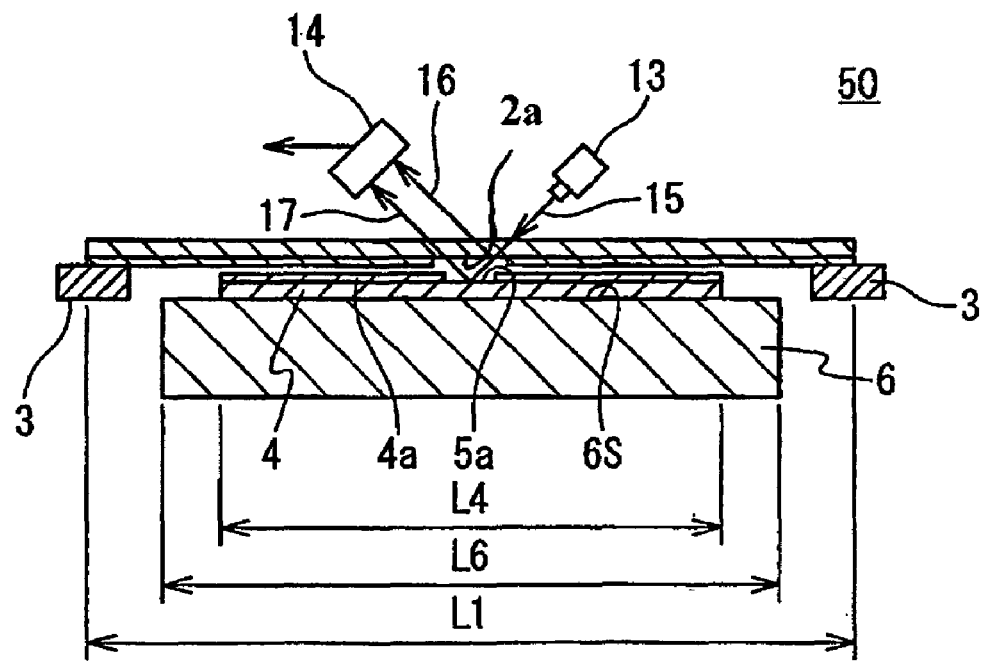

When the reflective regions 5 and 5a are provided on the substrate 4, as shown in FIG. 11, laser beams 9 emitted by laser beam emitters 7 are projected onto the reflective regions 5 through the gap measuring windows 2, and the laser beam 15 emitted by the laser beam emitter 13 is projected onto the reflective regions 5a through the gap measuring windows 2a as shown in FIG. 12. The reflective regions 5 and 5a increase the intensity of the reflected laser beams 11 and 17 from the substrate 4, which effectively improves the accuracy of the determination of the gaps between the mask 51 and the substrate 4.

Figure 13:
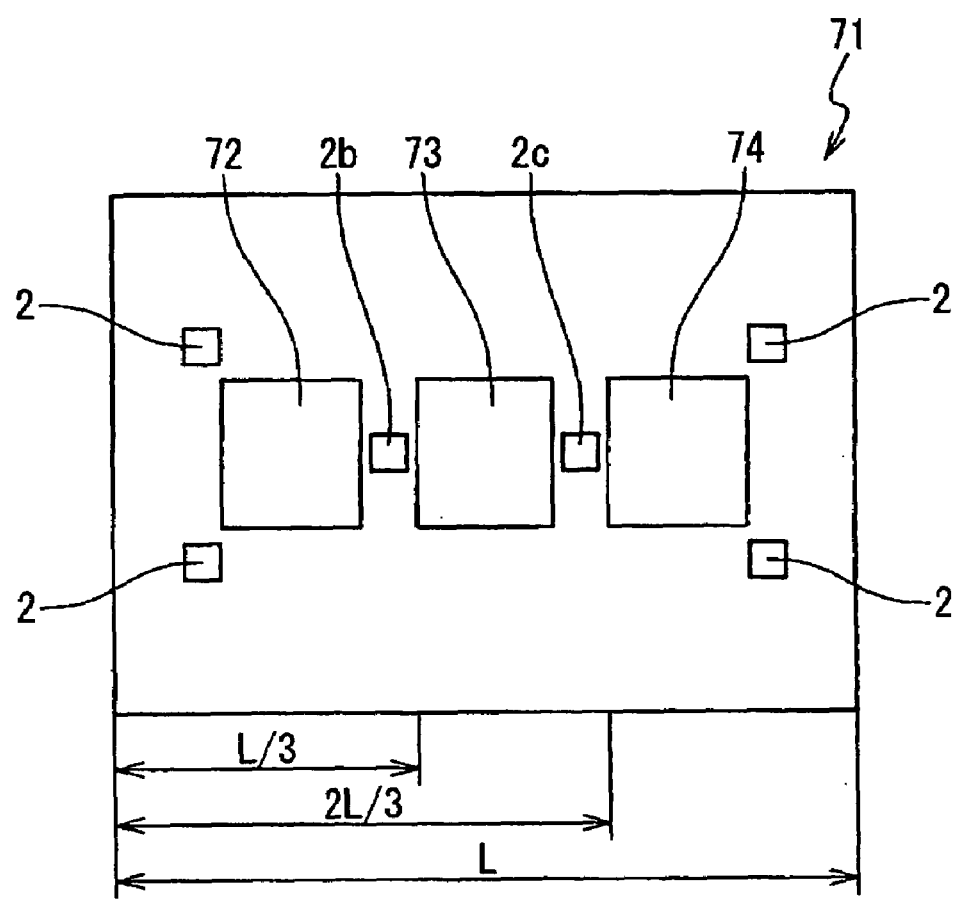
FIG. 13 shows a plan view of a substrate in an alternative embodiment.

In an alternative embodiment, with reference to FIG. 13, a mask 71 is used in place of the mask 51 in the exposure process. The mask 71 includes an array of the same patterns 72, 73, and 74 arranged in a row. Each of the patterns 72 to 74 corresponds to a complete display device (not to a portion of a display device). The patterns 72 to 74 are transferred to the substrate 4 by a photolithography technique.

The glass mask 71 includes gap measuring windows 2 near the corners thereof around the array of the patterns 72 to 74. The windows 2 are transparent regions that allow the laser beams 7 to pass through.

A gap measuring windows 2b and 2c are additionally disposed on the mask 71 to allow laser beams to pass through. The gap measuring window 2b is disposed in a non-patterned region between patterns 72 and 73, and the gap measuring window 2c is disposed in a non-patterned region between patterns 73 and 74. The gap measuring window 2b is positioned at a distance L/3 from the left edge of the mask 71, and the measuring window 2c is positioned a distance 2L/3 from the left edge of the mask 71, where L is the length of the mask 71.

In order to determine the gaps between the mask 71 and the substrate 4 near the corners thereof, laser beams are projected by the laser beam emitters 7 onto the substrate 4 through the gap measuring windows 2, and reflected laser beams are received by the laser beam detectors 8 from the mask 71 and the substrate 4. The gaps between the mask 71 and the substrate 4 near the corners thereof are determined on the basis of the positions of the spots of the reflected laser beams on the laser beam detectors 8.

Correspondingly, in order to determine gaps between the mask 71 and the substrate 4 in the middle region thereof, laser beams are projected onto the substrate 4 through the gap measuring windows 2b and 2c, and reflected laser beams are received by laser beam detectors from the mask 71 and the substrate 4. The gaps between the mask 71 and the substrate 4 in the middle regions thereof are determined on the basis of the positions of the spots of the reflected laser beams on the laser beam detectors. The reflected laser beams associated with the gap measuring window 2b provide information on the gap at the position L/3 from the left edge of the mask 71. Correspondingly, the reflected laser beams associated with the gap measuring window 2c provide information on the gap at the position 2L/3 from the left edge of the mask 71.

The deflection of the mask 71 is calculated on the basis of the gaps between the mask 71 and the substrate 4 near the corners thereof and the gaps in the middle region thereof. In response to the calculated deflection of the mask 71, the deflection remover 60 is operated to correct any deflection of the mask 71.

Figure 14:
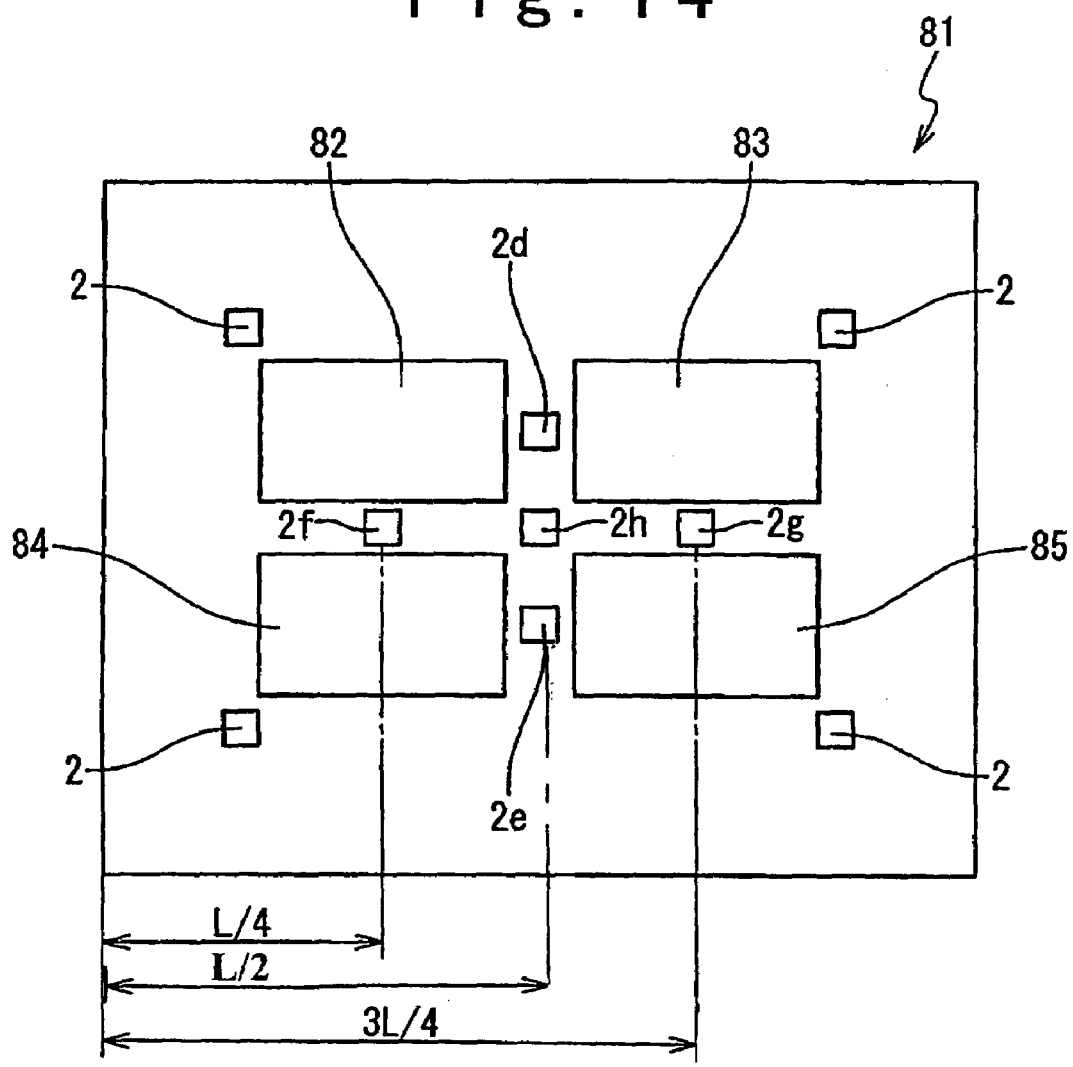
FIG. 14 shows a plan view of a substrate in another alternative embodiment.

In another alternative embodiment, as shown in FIG. 14, a mask 81 is used to achieve exposure in place of the mask 51.

The mask 81 includes an array of the same patterns 82 to 85 arranged in rows and columns. Each of the patterns 82 to 85 corresponds to a complete display device (not to a portion of a display device). The patterns 82 to 85 are transferred to the substrate 4 by a photolithography technique.

The mask 81 includes gap measuring windows 2 near the corners thereof around the array of the patterns 82 to 85. The windows 2 are transparent regions that allow the laser beams 7 to pass therethrough to determine the gaps between the mask 81 and the substrate 4 near the corners thereof.

A gap measuring windows 2d through 2h are additionally disposed on the mask 81 to allow laser beams to pass therethrough to determine the gaps between the mask 81 and the substrate 4 in the middle region thereof. The gap measuring window 2d is disposed in a non-patterned region between patterns 82 and 83, and the gap measuring window 2e is disposed in a non-patterned region between patterns 84 and 85. The gap measuring window 2f is disposed in a non-patterned region between patterns 82 and 84, and the gap measuring window 2g is disposed in a non-pattern region between patterns 83 and 85. The gap measuring window 2h is disposed at the center of the mask 81.

The determination of the gaps between the mask 81 and the substrate 4 is achieved by the aforementioned method. In order to determine gaps between the mask 81 and the substrate 4 near the corners thereof, laser beams are projected by laser beam emitters 7 onto the substrate 4 through the gap measuring windows 2, and reflected laser beams are received by laser beam detectors 8 from the mask 81 and the substrate 4. The gaps between the mask 81 and the substrate 4 near the corners thereof are determined on the basis of the positions of the spots of the reflected laser beams on the laser beam detectors 8.

Correspondingly, in order to determine gaps between the mask 81 and the substrate 4 in the middle region thereof, laser beams are projected onto the substrate 4 through the gap measuring windows 2d to 2h, and reflected laser beams are received by laser beam detectors from the mask 71 and the substrate 4. The gaps between the mask 81 and the substrate 4 in the middle regions thereof are determined on the basis of the positions of the spots of the reflected laser beams on the laser beam detectors. The reflected laser beams associated with the gap measuring window 2d, 2e, and 2h provide information on the gap at the position L/2 from the left edge of the mask 81. The reflected laser beams associated with the gap measuring window 2f provide information on the gap at the position L/4 from the left edge of the mask 81. The reflected laser beams associated with the gap measuring window 2g provide information on the gap at the position 3L/4 from the left edge of the mask 81.

The deflection of the mask 81 is calculated on the basis of the determined gaps between the mask 81 and the substrate 4 near the corners thereof and in those in the middle region thereof. In response to the calculated deflection of the mask 81, the deflection remover 60 is operated to correct any deflection of the mask 81.

One skilled in the art would appreciate that laser beams are not required to be projected through all the gap measuring windows 2d to 2h. Preferable combinations of the gap measuring windows 2d to 2h used to determined the gaps in the middle region are as follows:

(1) the gap measuring window 2h,
(2) the gap measuring windows 2h, 2f, and 2g,
(3) the gap measuring windows 2d (or 2e), 2f, and 2g,
(4) the gap measuring windows 2f, and 2g, (5) the gap measuring windows 2*h*, 2*d* (or 2*e*), 2*f*, and 2*g*, and (6) the gap measuring windows 2*h*, 2*d*, 2*e*, 2*f*, and 2*g*.

Those who are skilled in the art would also appreciate that the number of the rows and columns in which patterns are arranged may be three or more.

Although the invention has been described in its preferred form with a certain degree of particularity, it is understood that the present disclosure of the preferred form may be changed in the details of construction and the combination and arrangement of the parts may be changed without departing from the scope of the invention as hereinafter claimed.

What is claimed is:

1. A method comprising:
providing a mask which includes:
an array of patterns, each of which corresponds to a display device,
a window disposed between neighboring two of said patterns,
placing a substrate to face said mask;
projecting an incident laser beam onto said substrate through said window of said mask; and
determining a gap between said mask and said substrate in a middle region of said substrate in response to first and second reflected beams, said first reflected beam being generated by said incident laser beam reflected by said mask, and said second reflected beam being generated by said incident laser beam being reflected by said substrate.

2. The method according to claim 1, further comprising:
determining a deflection of said mask based on said determined gap in said middle region.

3. The method according to claim 1, wherein said mask further includes other windows disposed around said array of said patterns, and
wherein said method further comprises:
projecting other incident laser beams onto said substrate through said other windows;
determining gaps between said mask and said substrate near corners of said substrate in response to third and fourth laser beams, said third laser beams being generated by said other incident laser beams being reflected by said mask, and said fourth laser beams being generated by said other incident laser beams being reflected by said substrate, and
determining a deflection of said mask based on said determined gap in said middle region and said gaps near said corners.

4. The method according to claim 1, wherein said patterns are arranged in a row.

5. The method according to claim 1, wherein said patterns are arranged in rows and columns.

6. The method according to claim 1, wherein said substrate is covered with a photo resist, a portion of a main surface of said substrate being exposed, and
said second reflected laser beam is generated by said incident laser beam being reflected by said exposed portion.

7. An proximity exposure method comprising:
providing a mask which includes:
an array of patterns, each of which respectively corresponds to a display device,
a window disposed between neighboring two of said patterns,
placing a substrate on a substrate stage opposed to said mask;
projecting an incident laser beam onto said substrate through said window of said mask; and
determining a gap between said mask and said substrate in a middle region of said substrate in response to first and second reflected beams, said first reflected beam being generated by said incident laser beam reflected by said mask, and said second reflected beam being generated by said incident laser beam being reflected by said substrate; and
removing a deflection of said mask in response to said determined gap in said middle region.

8. The method according to claim 7, further comprising:
projecting other incident laser beams onto said substrate through said other windows;
determining gaps between said mask and said substrate near corners of said substrate in response to third and fourth laser beams, said third laser beams being generated by said other incident laser beams being reflected by said mask, and said fourth laser beams being generated by said other incident laser beams being reflected by said substrate, and
determining said deflection of said mask based on said determined gap in said middle region and said gaps near said corners.

9. The method according to claim 7, wherein said removing includes:
securing said mask and a glass plate to form a sealed space between said mask and said glass plate; and
inflating or evacuating said sealed space in response to said determined deflection.

10. The method according to claim 7, wherein said determining said gap in said middle region is executed every time said substrate is exchanged.

11. The method according to claim 7, wherein said determining said gap in said middle region is executed every time said mask is exchanged.

* * * * *